United States Patent
Sasaki et al.

(10) Patent No.: US 6,992,424 B2
(45) Date of Patent: Jan. 31, 2006

(54) PIEZOELECTRIC VIBRATOR LADDER-TYPE FILTER USING PIEZOELETRIC VIBRATOR AND DOUBLE-MODE PIEZOLECTRIC FILTER

(75) Inventors: Yukinori Sasaki, Hyogo (JP); Tetsuro Shimamura, Kyoto (JP); Tetsuo Kawasaki, Osaka (JP); Kazunari Nishihara, Osaka (JP); Tetsuya Furihata, Osaka (JP); Kuniaki Matsushita, Osaka (JP); Katsunori Moritoki, Osaka (JP); Katsu Takeda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/467,742

(22) PCT Filed: Feb. 7, 2002

(86) PCT No.: PCT/JP02/01013

§ 371 (c)(1),
(2), (4) Date: Dec. 9, 2003

(87) PCT Pub. No.: WO02/067424

PCT Pub. Date: Aug. 29, 2002

(65) Prior Publication Data

US 2004/0090147 A1 May 13, 2004

(30) Foreign Application Priority Data

Feb. 19, 2001 (JP) .............................. 2001-041329

(51) Int. Cl.
*H01L 41/08* (2006.01)
(52) U.S. Cl. ...................... 310/360; 310/365; 310/368

(58) Field of Classification Search ................ 310/320, 310/365, 360, 367, 368
See application file for complete search history.

(56) References Cited

U.S. PATENT DOCUMENTS

| | | | |
|---|---|---|---|
| 4,454,444 A | * | 6/1984 | Fujiwara et al. ............ 310/360 |
| 5,929,555 A | * | 7/1999 | Sugimoto et al. ........... 310/360 |
| 6,243,933 B1 | * | 6/2001 | Sugimoto et al. .......... 29/25.35 |

FOREIGN PATENT DOCUMENTS

| | | |
|---|---|---|
| JP | 56-83110 | 7/1981 |
| JP | 59-127413 | 7/1984 |
| JP | 59-182617 | 10/1984 |
| JP | 1-149608 | 6/1989 |

(Continued)

OTHER PUBLICATIONS

International Search Report corresponding to application no. PCT/JP02/01013 dated May 21, 2002.

*Primary Examiner*—Mark Budd
(74) *Attorney, Agent, or Firm*—RatnerPrestia

(57) ABSTRACT

A piezoelectric vibrator which uses lithium tantalate as a piezoelectric material and of which main vibration is thickness shear vibration. The thickness direction of the vibrator forms angle of 0°±5° to the X-axis of a single crystal. The longitudinal direction of vibrator lies, with the X-axis used as a rotation axis, in direction n +57°±2° clockwise from the Y-axis of the single crystal. A ratio L/H of the length L of the vibrator to the thickness H is not less than 15. A ratio Le/H of the length Le of the exciting electrode to the thickness H of the vibrator element portion is 3–6. Accordingly, a vibrator having improved temperature characteristics and a large Q is realized.

2 Claims, 16 Drawing Sheets

FOREIGN PATENT DOCUMENTS

| | | |
|---|---|---|
| JP | 1-152809 | 6/1989 |
| JP | 3-3514 | 1/1991 |
| JP | 5-243889 | 9/1993 |
| JP | 6-303090 | 10/1994 |
| JP | 6-303093 | 10/1994 |
| JP | 9-8594 | 1/1997 |

* cited by examiner

Electric charge distribution of s_0 mode

Electric charge distribution of a_0 mode

PIEZOELECTRIC VIBRATOR LADDER-TYPE FILTER USING PIEZOELETRIC VIBRATOR AND DOUBLE-MODE PIEZOLECTRIC FILTER

This application is a U.S. National Phase Application of PCT International Application PCT/JP02/01013.

TECHNICAL FIELD

The present invention relates to a piezoelectric vibrator and a piezoelectric filter which use lithium tantalate as piezoelectric material, and a ladder-type filter using this piezoelectric vibrator and a double-mode piezoelectric filter.

BACKGROUND ART

Among the piezoelectric vibrators based on the bulk waves travelling in solid material are a piezoelectric vibrator used in various kinds of electronic apparatus as the clock source and a piezoelectric filter used in communication apparatus for extracting a frequency. The piezoelectric vibrator formed of lithium tantalate, among other materials, is used as a VCO (voltage control oscillator) or a broad band band-pass filter; the material lithium tantalate having a higher coefficient of electro mechanical coupling as compared with rock crystal, etc. representing the high efficiency of conversion between electric energy and mechanical energy. Among the piezoelectric vibrators, those made of the X plate of single crystal lithium tantalate are primarily vibrated by thickness shear vibration, and exhibit, depending on a direction of cutting, improved temperature characteristics in the resonance frequency.

Japanese Patent Laid-Open Application No. S59-182617, for example, discloses a strip-type thickness shear mode vibrator using the X plate lithium tantalate for improved frequency temperature characteristics. For improving the frequency temperature characteristics of the vibrator, especially to minimize a secondary temperature coefficient as well as a primary temperature coefficient, it is cut out so that the longitudinal direction of the vibrator lies, with the X-axis used as rotation axis, in a direction +48°±4° clockwise from the Y-axis (hereinafter, such direction is referred to simply as, e.g. +48°±4° from Y-axis), and a ratio Le/H of the length Le of an exciting electrode to the thickness H of the vibrator is not higher than 3.8. The terminology strip-type vibrator means a vibrator of strip shape, the cross sectional area of which being rectangular, and provided with exciting electrode disposed covering the entire width.

Japanese Patent Laid-Open Application No. H3-3514 teaches a vibrator which has an advantage of easy and precise processing, where the longitudinal direction forms an angle of +57° from the Y-axis. By so doing, the longitudinal direction coincides with cleavage direction of lithium tantalate.

FIG. 17 shows a conventional piezoelectric vibrator. Vibrator 50 includes vibrator element 51 formed of the X plate of single crystal lithium tantalate, exciting electrodes 52 provided opposed on the front and the reverse surfaces of the vibrator element, connection electrode 53 provided for connection with external devices, and lead electrode 54 for electrically connecting exciting electrode 52 with connection electrode 53.

In the conventional strip-type vibrator formed of the X plate lithium tantalate piezoelectric material, with its longitudinal direction forming an angle of +48° from the Y-axis, as shown in FIG. 17, the ratio Le/H has been set not to be higher than 3.8 for the purpose of improving the temperature characteristics. As the result, an area for exciting electrode can not be sufficiently large, resonance impedance increases and mechanical quality coefficient Q deteriorates. These problems have become increasingly significant in the face of the decreased thickness, decreased width dimension, decreased length of exciting electrode and decreased width dimension of exciting electrode of a vibrator caused as the results of introduction of higher frequencies.

If the angle of longitudinal direction of a vibrator is other than +48° from Y-axis, the vibrator exhibits different temperature characteristics. Conditions required for improving the temperature characteristics with a vibrator whose longitudinal direction is +57° from Y-axis have been unknown.

DISCLOSURE OF THE INVENTION

The present invention aims to improve the temperature characteristics and provide a high Q for those vibrators whose longitudinal direction is +57° from Y-axis, the processing at which angle being easy.

The piezoelectric vibrators and filters in accordance with the present invention have the following structures.

In a first structure, a ratio L/H of the length L of the vibrator to the thickness H of the vibrator is at least 15, a ratio Le/H of the length Le of an exciting electrode to the thickness H of the vibrator is 3–6. This configuration realizes improved temperature characteristics and a high Q.

In a second structure, a ratio W/H of the width W of the vibrator to the thickness H of the vibrator is any one among the range groups of 1.5–2.1, 2.5–3.2, 3.7–4.3 and 4.9–5.3. In this configuration, the vicinity of primary vibration's resonance frequency can be kept to be free from the spurious due to the width dimension, and stable temperature characteristics can be implemented.

In a third structure, a first vibrator, a second vibrator and a third vibrator are electrically connected. In the first vibrator, a ratio W/H is any one among the ranges of 1.5–2.2, 2.4–3.4, 3.7–4.5 and 4.8–5.5. In the second vibrator, a ratio W/H is any one among the ranges of 1.5–2.3, 2.5–3.5, 3.7–4.6 and 4.9–5.6. In the third vibrator, a ratio W/H is any one the ranges of among 1.5–2.4, 2.6–3.5, 3.8–4.6 and 5.0–5.8. In this configuration, filters of superior temperature characteristics and small insertion loss are realized.

In a fourth structure, an element is provided with a pair of input electrode and output electrode disposed on one of the main surfaces, and the ground electrode on the other main surface. A ratio Li/H of the length Li of input electrode to the element thickness H and a ratio Lo/H of the length Lo of output electrode to the element thickness H are, respectively, 1.5–3. In this configuration, filters of superior temperature characteristics and small insertion loss are realized.

DETAILED DESCRIPTION OF PREFERRED EMBODIMENTS

Figure 1:
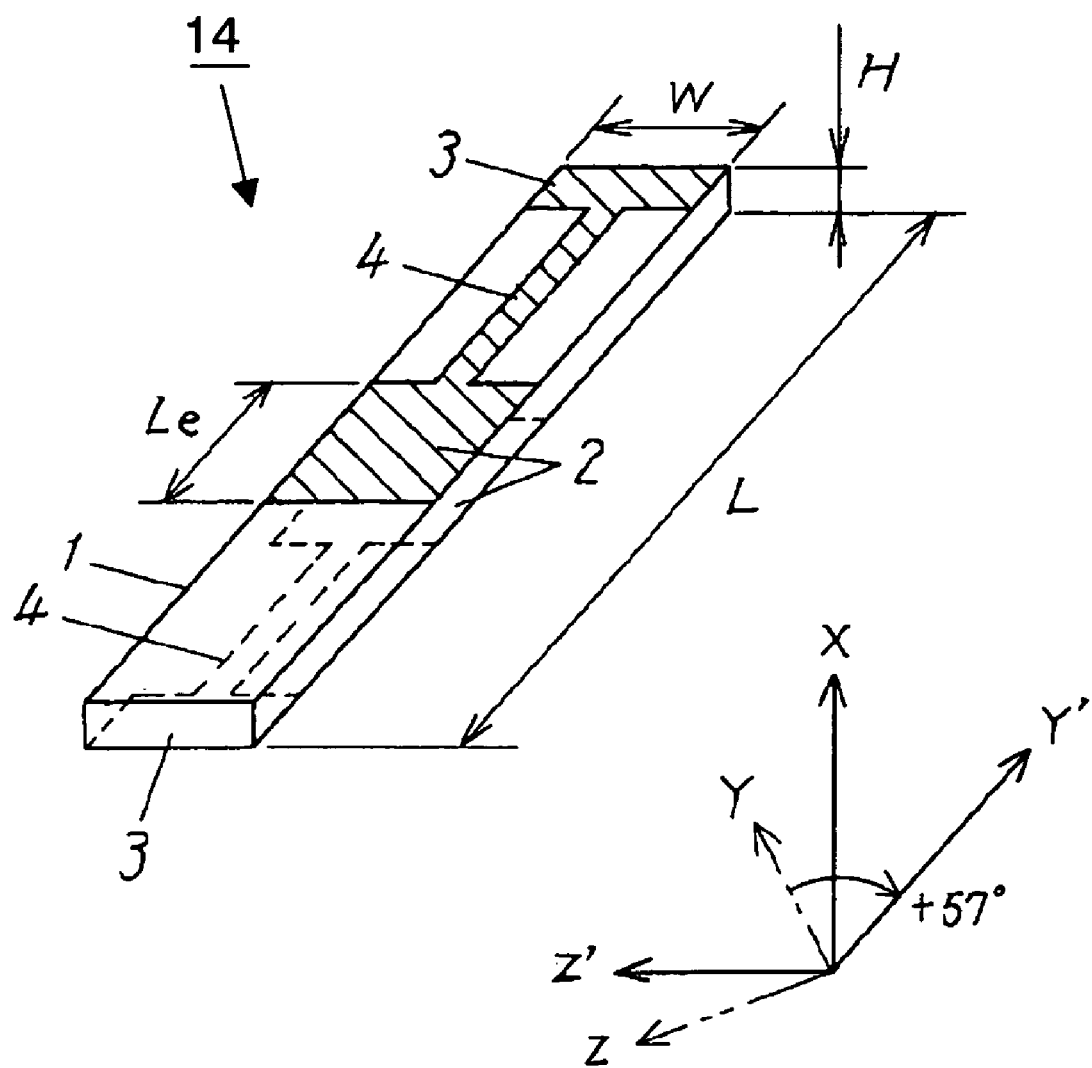
FIG. 1 shows perspective view of a piezoelectric vibrator in accordance with an exemplary embodiment of the present invention.

Exemplary embodiments of the present invention are described below referring to the drawings.

As shown in FIG. 1, piezoelectric vibrator 14 in the present embodiment includes vibrator element portion 1 made of the X plate of single crystal lithium tantalate which is provided with exciting electrodes 2 disposed opposed on the front and the reverse surfaces, connection electrode 3 for connection with external devices and lead electrode 4 for electrically connecting exciting electrode 2 with connection electrode 3. The vibrator element portion has been provided by cutting out of the single crystal so that the longitudinal direction of vibrator element lies, with the X-axis used as rotation axis, in a direction +57° clockwise from the Y-axis (hereinafter, such direction is referred to simply as, e.g. +57° from Y-axis). The longitudinal direction of vibrator element is allowed to be lying at the vicinity of said +57°; precisely described, +57°±2°. The thickness direction of vibrator element portion 1 is substantially in parallel with the X-axis of single crystal lithium tantalate (precisely described, within an angle 0±5°).

Main factors determining the temperature characteristics of a thickness shear mode vibrator using the X plate lithium tantalate are the direction of cutting and the coefficient of confinement.

When thinking of the former factor, direction of cutting, it is better to take into consideration such items as the spurious suppression, the ease of processing, etc., besides the temperature characteristics. The vibrators of the X plate lithium tantalate have two thickness shear vibrations crossing each other at right angle within a plane. The vibrations are called as fast mode and slow mode, respectively, in accordance with difference in the sonic speed. Because the fast mode has a larger coefficient of electromechanical coupling as compared to the slow mode, the fast mode is used as the main vibration in most of the cases. Transmitting direction of the fast mode vibration is determined by an anisotropic property of the crystal. It has been known that the direction lies at the vicinity of +50° from Y-axis. The spurious can be suppressed when the longitudinal direction of a vibrator coincides with the above direction. However, along with introduction of the higher frequencies, the vibrator thickness becomes smaller, also the width smaller. Then, the spurious due to chipping or micro-cracks caused at the end-face during processing of vibrator can not be ignored. The chipping and micro-cracks at the end-face can be reduced when the longitudinal direction of a vibrator and the cleavage direction, which is an easily-breakable direction for the X plate lithium tantalate, are made to coincide. By so doing, the spurious due to chipping or micro cracks can be reduced.

The cleavage direction, or a direction +57° from Y-axis, is not deviating far from the direction of fast mode transmission, or a vicinity of +50°. So, it is hardly affected by the spurious due to inconsistency between the direction of vibration displacement, or the longitudinal direction of vibrator, and the direction of vibration transmission.

As to the latter factor, the coefficient of confinement ζ is determined by $$\zeta = Le/H \times ((f_0' - f_0)/f_0')^{1/2}$$

where: Le representing the length of exciting electrode, H the thickness of vibrator element portion, $f_0$ the cutoff frequency at exciting electrode portion, $f_0'$ the cutoff frequency at no-electrode portion. The $f_0'$ is determined solely by the cutting direction of lithium tantalate. The $f_0$ changes depending on mass of electrode formed by vacuum evaporation or plating process, etc. on the main surface of vibrator. As to magnitude of influence given to the ζ, ratio Le/H is, to be described later, approximately 3 to 6, or it can readily change to approximately double; while that of the term $((f_0' - f_0)/f_0')^{1/2}$ is about 0.3, and makes only a trivial change. Thus, Le/H has an overwhelming influence to the temperature characteristics.

Figure 2:
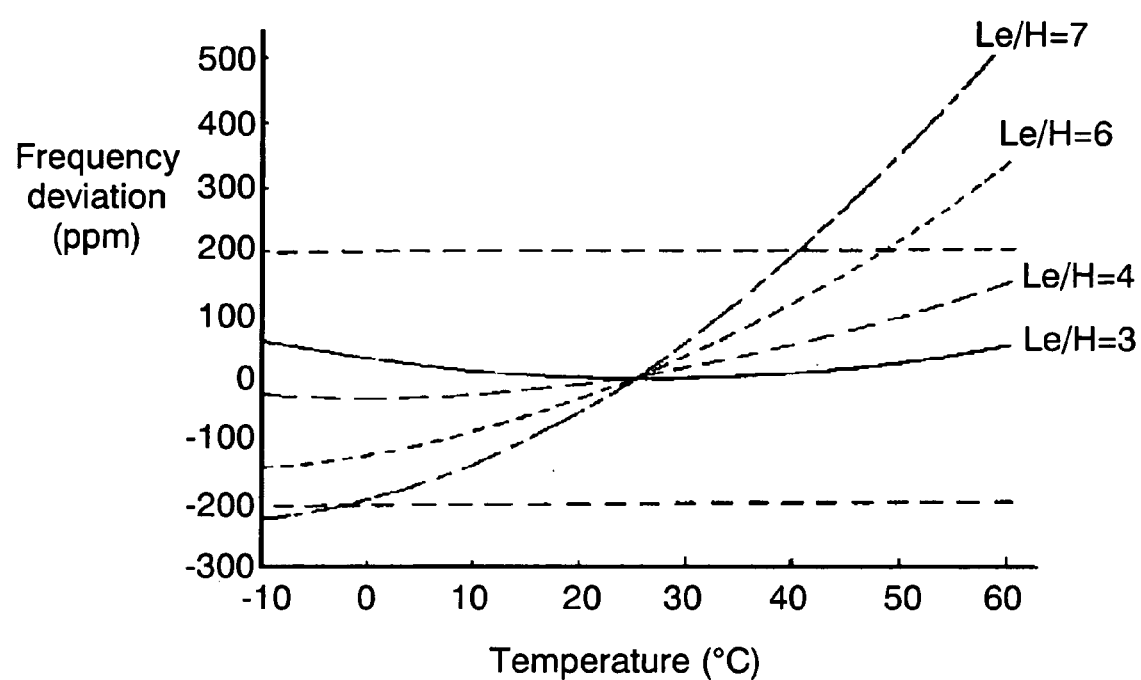
FIG. 2 is a graph used to describe a relationship between the temperature and the frequency deviation in a piezoelectric vibrator, whose longitudinal direction lies, with the X-axis used as rotation axis, in a direction +48° clockwise from the Y-axis.
Figure 3:
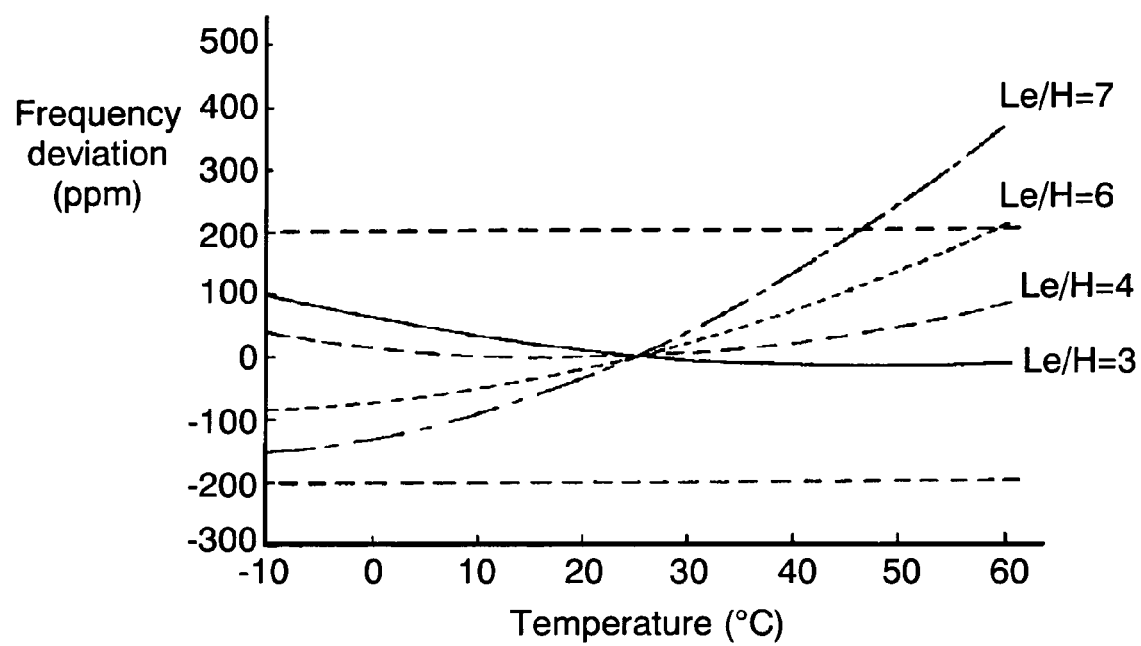
FIG. 3 is a graph used to describe a relationship between the temperature and the frequency deviation in a piezoelectric vibrator, whose longitudinal direction lies, with the X-axis used as rotation axis, in a direction +57° clockwise from the Y-axis.

FIG. 2 and FIG. 3 show temperature characteristics with 25° C. as the reference point; where the vertical axis representing the frequency deviation of main vibration resonance frequency, the horizontal axis representing the temperature.

The temperature characteristics for ratios Le/H 3, 4, 6 and 7 are shown. FIG. 2 exhibits the case where the longitudinal direction of vibrator is +48° from Y-axis, while FIG. 3 exhibits the case where the longitudinal direction of vibrator is +57° from Y-axis.

Referring to FIG. 2 and FIG. 3, the primary coefficient of the frequency temperature characteristics is substantially 0, however, it is unable to make the secondary coefficient to be 0. Therefore, the temperature characteristics exhibit a secondary curve. In the normal practical application, it is acceptable if change in the main vibration's resonance frequency due to temperature shift is suppressed within a frequency deviation range of ±200 ppm from the reference temperature 25° C., covering a temperature range of −10° C. to 60° C. FIG. 2 teaches that for those vibrators whose longitudinal direction is +480 from Y-axis, a ratio Le/H not greater than 4 satisfies the above requirements. FIG. 3 teaches that for those whose longitudinal direction is +57° from Y-axis, a ratio Le/H not greater than 6 satisfies the above requirements.

If a ratio Le/H is not greater than 3, it means the area for exciting electrode is too small, and the energy confinement is insufficient. This results in an increased resonance impedance and a deteriorated Q, rendering it inappropriate for practical application.

Figure 4:
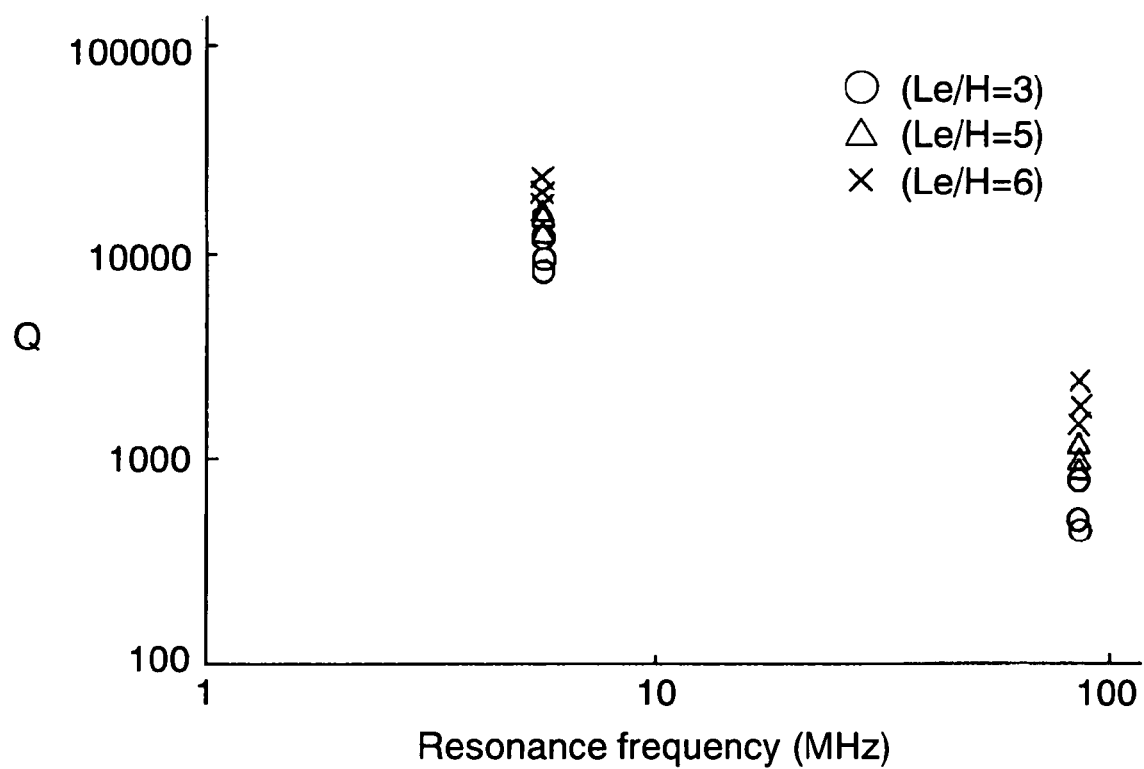
FIG. 4 is a graph used to describe a relationship between the resonance frequency and the mechanical quality coefficient Q, with the piezoelectric vibrator.

Relationship between the main vibration resonance frequency and Q of the vibrators whose longitudinal direction is +57° from Y-axis is shown in FIG. 4. Where, symbol "O" represents those whose Le/H is 3, symbol "Δ" those whose Le/H is 5, and symbol "x" those whose Le/H is 6. When the resonance frequency is as low as approximately 5 MHz, the Q substantially exceeds 10000 with all of the samples of ratio Le/H 3, 5 and 6. However, when the resonance frequency is as high as around 80 MHz, the Q lowers as the result of the higher frequency. This becomes more significant with the smaller ratio Le/H. At resonance frequency 80 MHz, the Q is 100 or higher with those whose Le/H is 5 or higher. Whereas, the Q is as low as approximately 50° with those whose Le/H is 3.

Now in the following, a ratio L/H of the length L of the vibrator to the thickness H of the vibrator is described.

Figure 5:
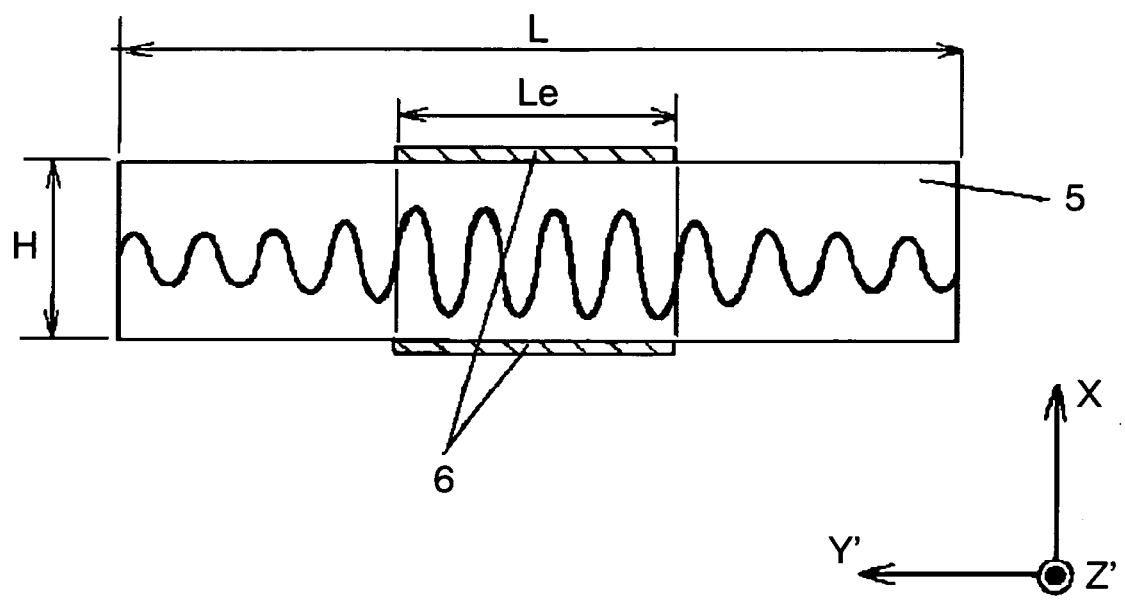
FIG. 5 shows cross sectional view of an energy confinement type piezoelectric vibrator.

FIG. 5 shows cross sectional view of a thickness shear mode vibrator using the X plate lithium tantalate, as viewed from the longitudinal side.

In the energy confinement type vibrators, such as a thickness shear mode vibrator using the X plate lithium tantalate, the energy is confined in the portion of opposing exciting electrodes 6 of vibrator element 5, as illustrated in FIG. 5. The vibration energy is known to be attenuating exponentially towards the ends of the vibrator element.

If the ratio L/H is not sufficiently large, displacement of the vibration at the ends of vibrator element is not small enough. The vibration is reflected at the ends of element to cause the spurious.

Figure 6A:
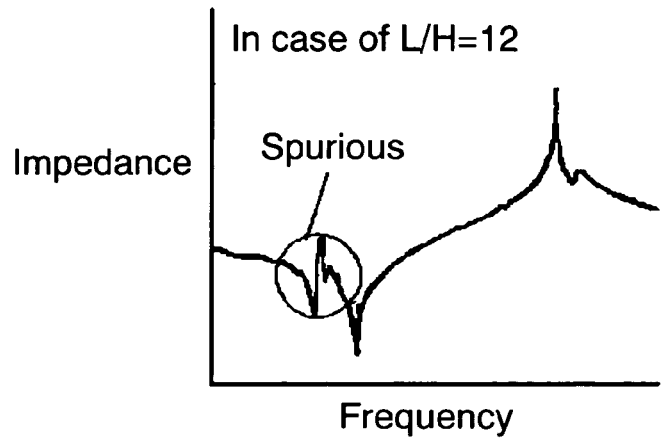
FIGS. 6(a)–(c) show impedance curves of the piezoelectric vibrator, with a ratio L/H of the vibrator length L to the vibrator thickness H varied.

FIGS. 6(a), (b) and (c) show impedance curves for the ratio L/H 12, 15 and 18, respectively. Ratio Lie/H is fixed at 5 for all of the samples.

Figure 6B:
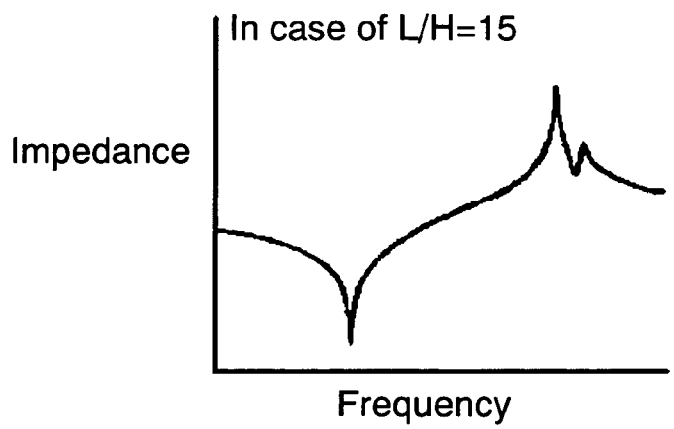
Figure 6C:
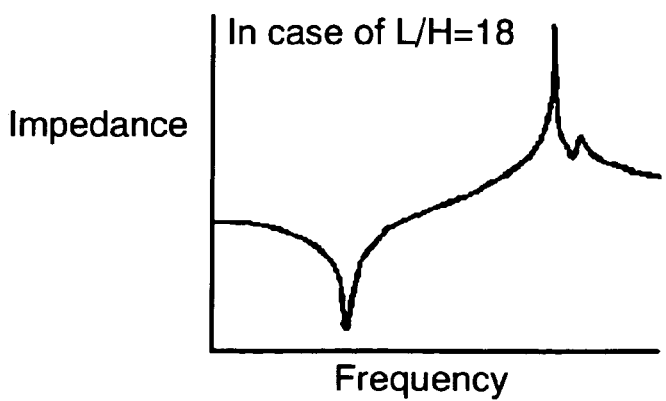
Figure 7A:
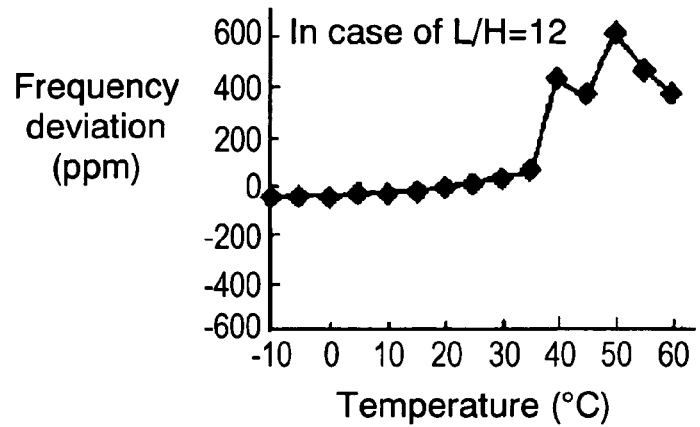
FIGS. 7(a)–(c) are graphs used to describe a relationship between the vibrator temperature and the frequency deviation, with a ratio L/H of the vibrator length L to the vibrator thickness H varied.

FIGS. 7(a), (b) and (c) show temperature characteristics corresponding to respective items of FIG. 6.

As FIG. 6(a) shows, the sample of L/H 12 exhibits the spurious at the vicinity of main vibration resonance point because the L/H ratio is not large enough. The corresponding temperature characteristics shown in FIG. 7(a) indicate that the main vibration and the spurious combine at 40° C. and up to deteriorate the temperature characteristics. The samples of L/H 15 and 18 show favorable performance with respect to both the impedance curve and the temperature characteristics.

It has been experimentally confirmed that the samples of L/H 15 or higher do not exhibit the spurious due to too small L/H ratio, and their performances are satisfactory.

Furthermore, the samples of L/H 15 or 18, corresponding to FIG. 6(b) or (c), have high Q values 1000 or higher, despite the main vibration resonance frequency exceeding 80 MHz. The high Q at the high frequency is attributable to the large area in the exciting electrode.

Next, in order to avoid the spurious due to width dimension, an appropriate ratio W/H of the width W of the vibrator to the thickness H of the vibrator has to be selected.

Figure 8:
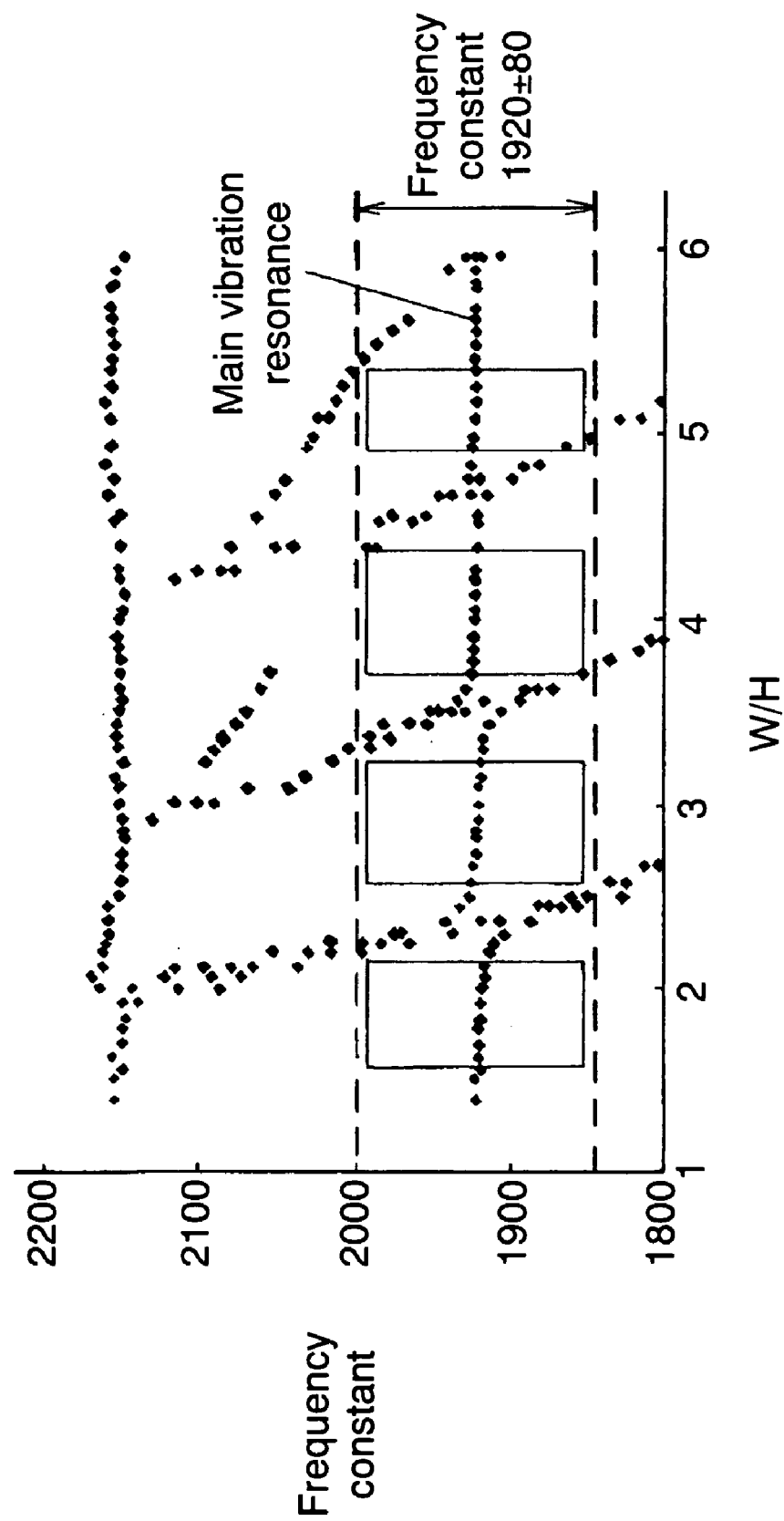
FIG. 8 is a graph used to describe a relationship between a ratio W/H of vibrator width W to vibrator thickness H and the frequency constant.

FIG. 8 shows frequency chart of vibrators whose longitudinal direction is +57° from Y-axis.

Horizontal axis of the frequency chart represents a ratio W/H, while the vertical axis the frequency constant defined by the product of the resonance frequency of main vibration, spurious, etc. and the vibrator thickness.

FIG. 8 plots results of measurement made with vibrator samples having varied widths, while the thickness fixed. Since the main vibration, or the thickness shear vibration, is relevant to thickness of the vibrator, the frequency constant stays substantially fixed at approximately 1920, staying outside the influence of ratio W/H.

Frequency constant of main vibration at the anti-resonance point is determined mostly by a direction of cutting; so, it is approximately 2100. This too is substantially fixed, without being relevant to ratio W/H.

However, the spurious like the width flexural vibration shifts in the resonance frequency, when the width dimension is changed. Therefore, main vibration and the spurious take very close frequency constants at ratio W/H 3.5 and the vicinity. Accordingly, resonance frequency of the main vibration and resonance frequency of the spurious turn out to be very close to each other.

Figure 7B:
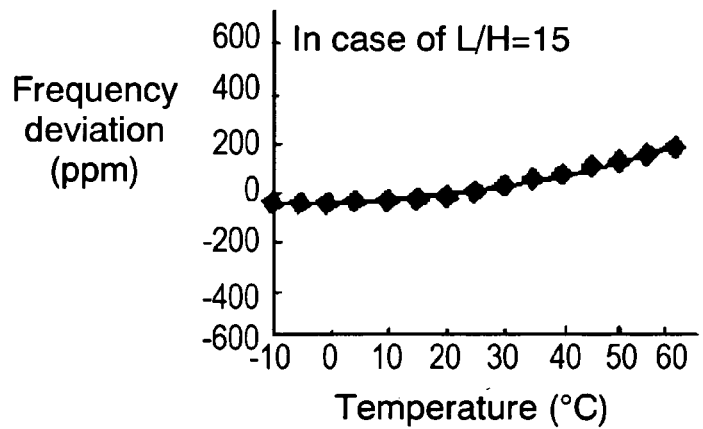
Figure 7C:
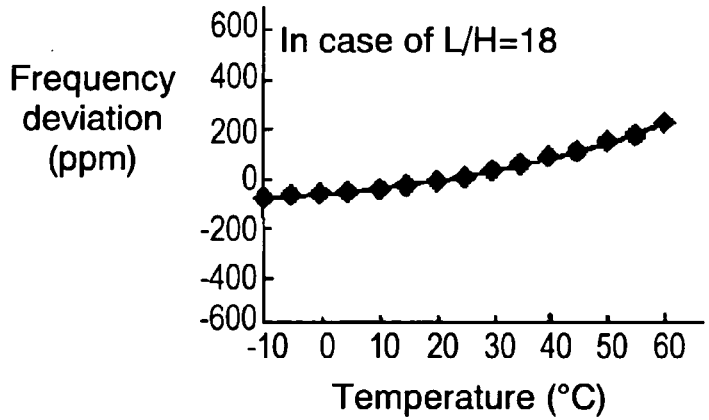

As described earlier referring to FIG. 6 and FIG. 7, since temperature coefficient of the spurious is much larger than that of main vibration, the temperature characteristics can be deteriorated if there exists the spurious at the vicinity of main vibration resonance. In practical cases, however, the temperature characteristics are not ill-affected in the cases where there is no spurious within a range 1920±80 of frequency constant at the main vibration's resonance point.

In FIG. 8, squares designate regions free from the spurious.

It is understood that for a circumstance of no-spurious within a range of frequency constant 1920±80 with the main vibration's resonance, the corresponding ratio W/H is any one among the ranges of 1.5–2.1, 2.5–3.2, 3.7–4.3 and 4.9–5.3.

Figure 9A:
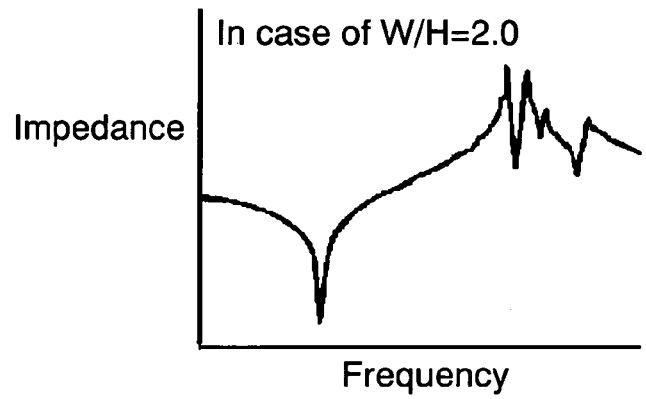
FIG. 9(a)–(c) show impedance curves of the piezoelectric vibrator, with a ratio W/H of the vibrator width W to the vibrator thickness H varied.
Figure 9B:
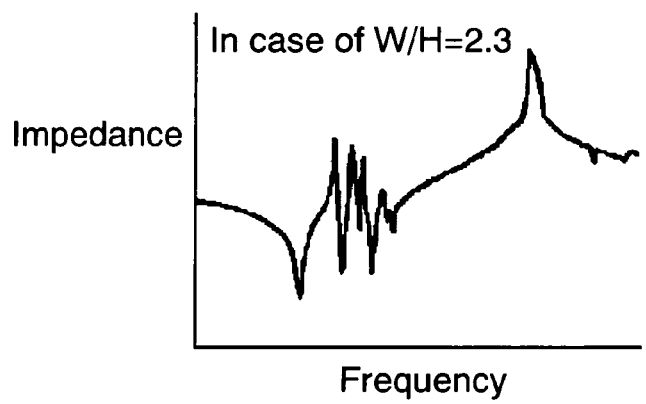
Figure 9C:
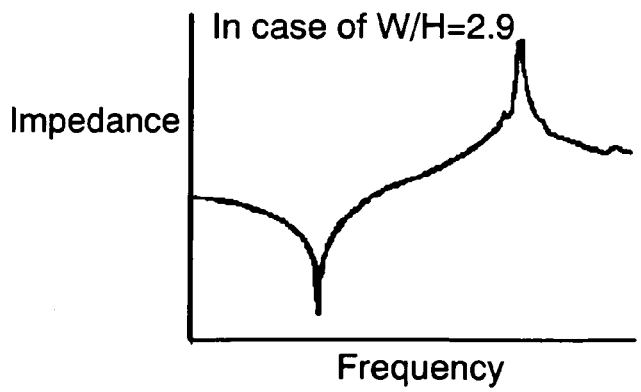

As an example, impedance curves of three sample vibrators are shown in FIGS. 9(a), (b) and (c), the sample vibrators having the widths W 0.7 mm, 0.8 mm and 1.0 mm, while the thickness H remaining at 0.35 mm.

It becomes known from the above that:

When W is 0.7 mm, namely W/H is about 2.0, the spurious is at the vicinity of main vibration's anti-resonance point, and the characteristics are favorable. When W is 0.8 mm, namely W/H is about 2.3, the spurious is close to the main vibration's resonance point. When W is as large as 1.0 mm, namely W/H is about 2.9, no spurious is at the vicinity of main vibration's resonance point, and the characteristics are favorable.

Thus, by selecting a ratio W/H from any one among the range groups of 1.5–2.1, 2.5–3.2, 3.7–4.3 and 4.9–5.3 for the vibrators whose longitudinal direction is +57° from Y-axis, the spurious due to width dimension can be kept away from the main vibration's resonance point, and there will be no deterioration in the temperature characteristics. Especially, in order to curtail the Q deterioration under the environment of high resonance frequency of the main vibration to the smallest possible, it is preferred to increase the area of exciting electrode to a largest possible. For that purpose, a value of the ratio W/H should be maximized within the above-described preferable range.

A band pass filter which allows only a certain specific frequency band to pass through can be implemented by combining a plurality of vibrators. The principle is described referring to FIG. 10.

Figure 10A:
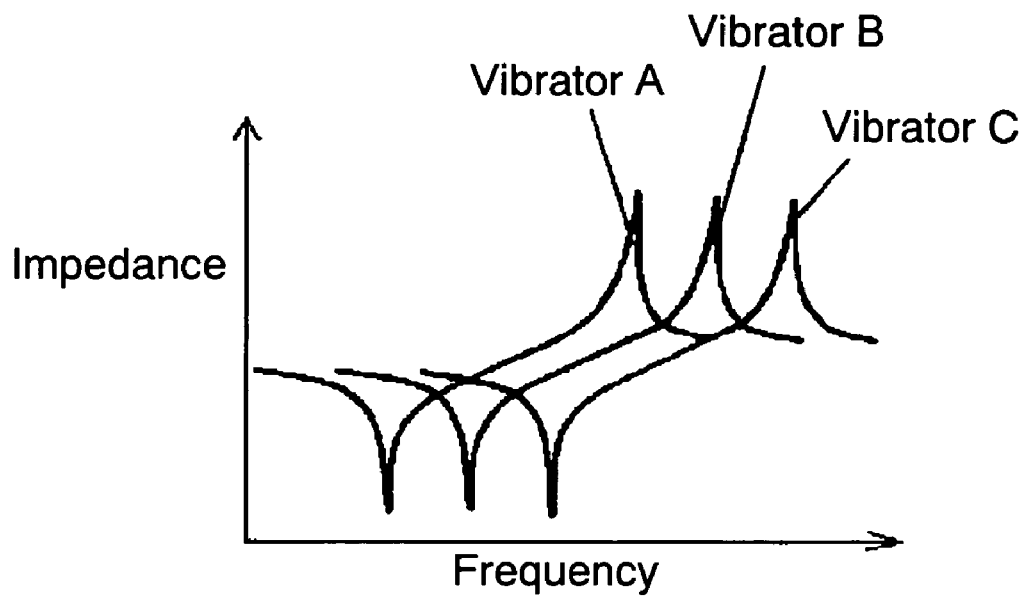
FIG. 10(a) shows impedance curves of three types of vibrators forming a ladder-type filter in accordance with the present invention.
Figure 10B:
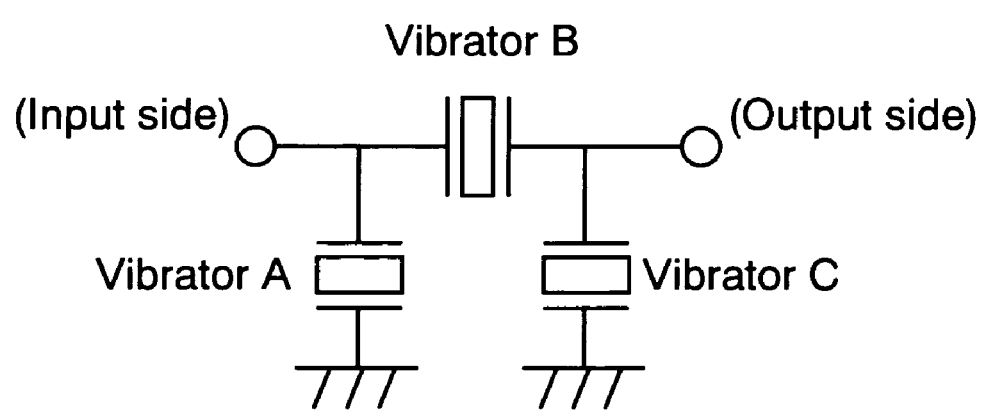
FIG. 10(b) shows the wiring diagram.

FIG. 10(a) shows impedance curves of three types of vibrators, each having its own resonance frequency of main vibration. FIG. 10(b) shows a circuit diagram connecting the vibrators.

A filter having the wiring as shown in FIG. 10(b) is called a ladder-type filter.

Figure 11A:
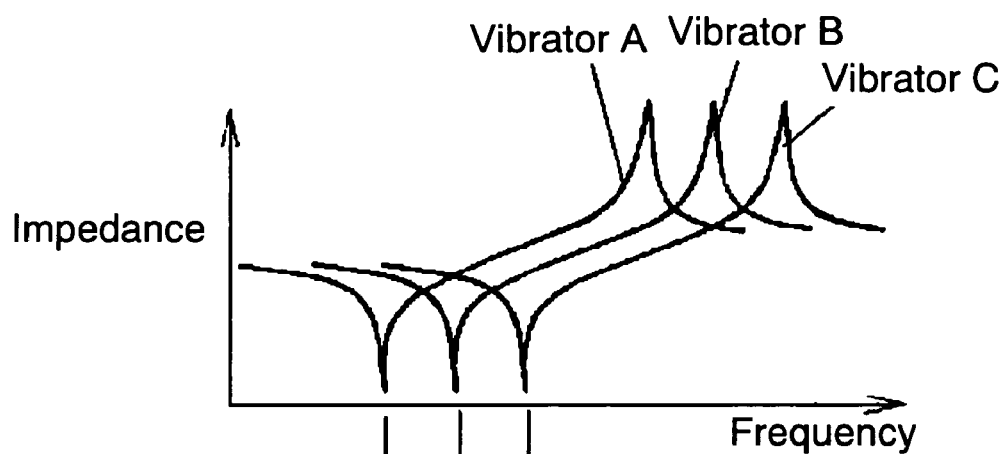
FIGS. 11(a), (b) show a relationship between the impedance curves and the filter characteristics in the three types of vibrators forming the ladder-type filter.

The filtering characteristics are as shown in FIGS. 11(a) and (b). This filter works as a band pass filter, wherein respective resonance frequencies of vibrator A and vibrator C function as the filtering poles, while resonance frequency of vibrator B as the central frequency of a pass band. Among the signals delivered to input side, only a signal of pass band frequency is sent to output side.

If vibrator C has the spurious at the vicinity of resonance, ripples might appear in the pass band region of the filter, which affects the flatness of attenuation in the pass band region. If vibrator A or vibrator B has the spurious at the vicinity of resonance, it might become difficult to secure a sufficiently large amount of attenuation at the vicinity of the filter pole.

Figure 11B:
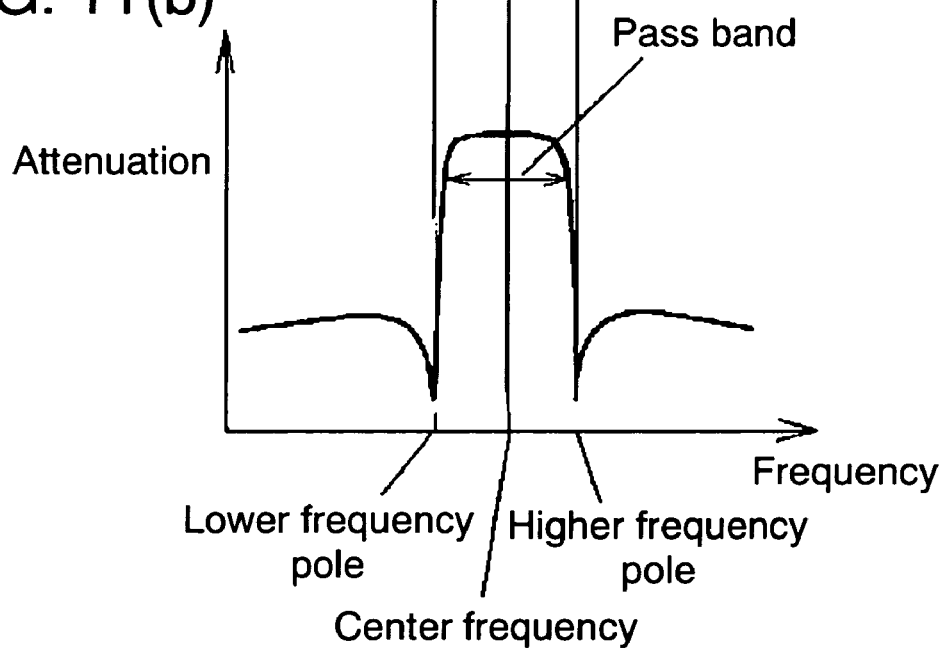

So, like in the case of single-use vibrators, those used for a filter are also requested not to have the spurious at the vicinity of resonance point of main vibration. As illustrated in FIG. 11, with respect to vibrator A, the region of higher frequency than the main vibration's resonance point is the pass band region of the filter. Therefore, no spurious is allowed in the region. On the other hand, the region of lower frequency than the main vibration's resonance point is not the pass band region; therefore, even if there is the spurious in the region the filter characteristics are not ill-affected.

Contrary to vibrator A, the region of lower frequency than the main vibration's resonance point in vibrator C is the pass band region of the filter. Therefore, no spurious is allowed in the region. On the other hand, the region of higher frequency than the main vibration's resonance point is not the pass band region; therefore, even if there is the spurious in the region it does not give a substantial influence to the filter characteristics.

Thus, respective vibrators forming the lower frequency pole and the higher frequency pole have their own specific no-spurious regions at the vicinity of the main vibration's resonance point.

In the same token, the no-spurious range of the vibrator whose resonance frequency serves as the central frequency of the filter is different from that of the pole-setting vibrators.

With a vibrator for setting the pole of lower-frequency side, the no-spurious range is not lower than 1910 not higher than 1970 in terms of frequency constant. With a vibrator for setting the pole of higher-frequency side, the no-spurious range is not lower than 1870 not higher than 1930 in terms of the frequency constant. With a vibrator whose main vibration resonance frequency serves as the central frequency of the filter, the no-spurious range is not lower than 1890 not higher than 1950 in terms of the frequency constant.

The preferable ranges in terms of the ratio W/H corresponding to respective frequency constants can be determined by applying these conditions to FIG. 8.

The outcome is as follows:

In the vibrator for setting the pole of lower-frequency side, the preferable range in terms of the ratio W/H is any one among the ranges of 1.5–2.2, 2.4–3.4, 3.7–4.5 and 4.8–5.5. In the vibrator whose main vibration resonance frequency serves as the central frequency of the filter, it is any one among the ranges of 1.5–2.3, 2.5–3.5, 3.7–4.6 and 4.9–5.6. In the vibrator for setting the pole of higher-frequency side, it is any one among the ranges of 1.5–2.4, 2.6–3.5, 3.8–4.6 and 5.0–5.8.

As a result, the vibrators are provided with a broader range for selecting the width dimension, which leads to an improved manufacturing yield rate. When a width dimension of vibrator is selected from among the above-described respective W/H ratios, the spurious due to width dimension does not appear in the pass band region, and the vicinity, of the filter. Thus, the filters of superior temperature characteristics are implemented; in the pass band region, ripple due to temperature shift does not appear, and no deterioration in the amount of attenuation at the pole. Like in the case of single-use vibrators, by selecting a largest possible value for the ratio W/H within the good-product range, Q of the vibrators constituting a filter can be made higher even in high frequencies. Thus, the insertion loss of filter can be reduced.

Besides the ladder-type filters, there is a multi-mode band pass filter, which is a band pass filter formed of a plurality of piezoelectric vibrators disposed on one piezoelectric plate whose vibrations are coupled. Such type of filters is sometimes called as MCF (Monolithic Crystal Filter), where it positively utilizes the inharmonic overtone like a_0 mode, s_1 mode, etc.

In the following, a double-mode filter using two modes, s_0 mode and a_0 mode, is described as an example.

Figure 12A:
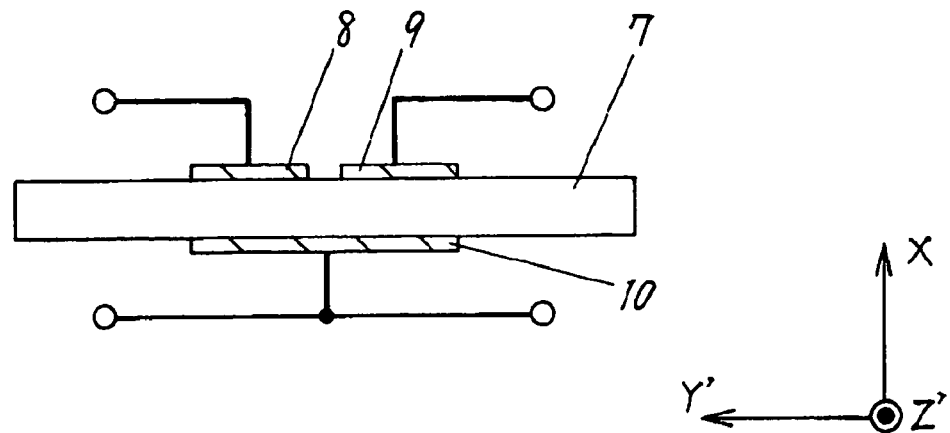
FIG. 12(a) is cross sectional view of a double-mode piezoelectric filter in accordance with the present invention.

FIG. 12(a) shows an example of double-mode filter structure.

In a double-mode filter of FIG. 12(a), a couple of input electrode 8 and output electrode 9 is provided on one of the main surfaces of X plate lithium tantalate, with a very small gap in between the electrodes; while on the other main surface, electrode 10 for grounding. In this way, the s_0 mode which is a symmetrical mode and the a_0 mode which is an oblique-symmetrical mode are provided to implement a band pass filter.

Figure 12B:
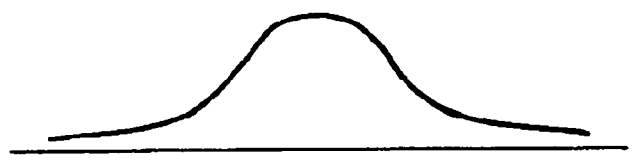
FIG. 12(b) shows a curve of the s_0 mode electric charge distribution.
Figure 12C:
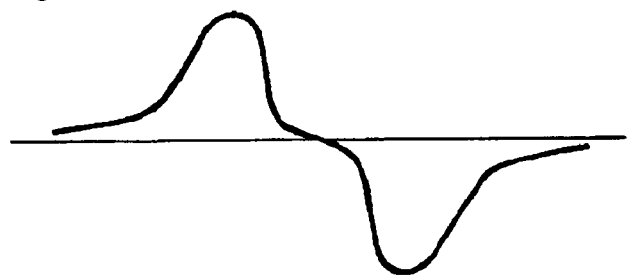
FIG. 12(c) shows a curve of the a_0 mode electric charge distribution.

FIGS. 12(b) and (c) show distribution of electric charges corresponding to the respective modes.

The s_0 mode is line-symmetric with respect to the longitudinal direction of a vibrator, but the a_0 mode is not line-symmetric. This is why the s_0 mode is called a symmetrical mode, while the a_0 mode an oblique-symmetrical mode.

Figure 13:
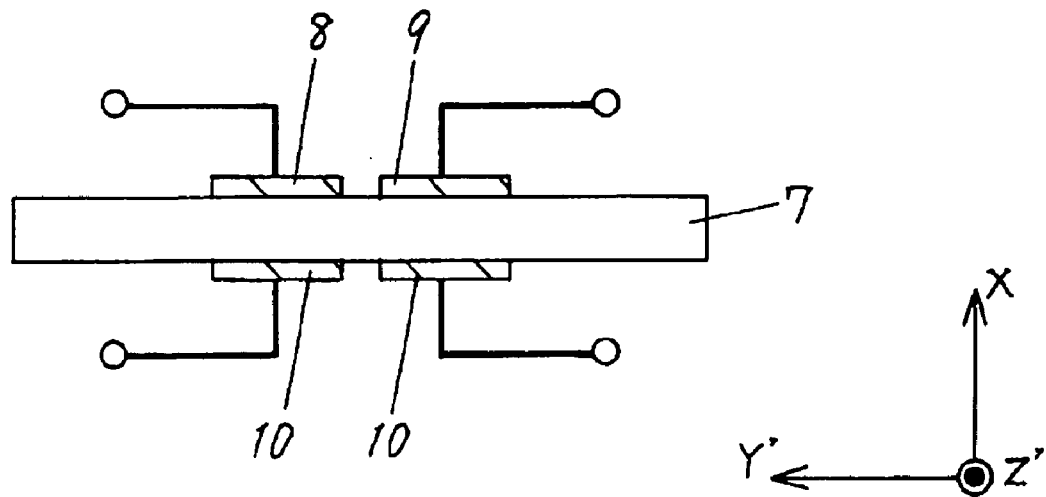
FIG. 13 is cross sectional view of a double-mode piezoelectric filter in accordance with the present invention.

Although ground electrode 10 is provided for only one in FIG. 12(a), the ground electrode may be provided for a plurality as shown in FIG. 13, opposing to input electrode 8 and output electrode 9 respectively.

The s_0 mode is identical to vibration mode of the thickness shear vibration, which is the main vibration of a vibrator. The small gap provided between the input electrode and the output electrode is negligibly small as compared to the length Li of input electrode and the length Lo of output electrode. Therefore, in order to improve the temperature characteristics of double-mode filter, a ratio (Li+Lo)/H of the sum of the length Li of the input electrode and the length Lo of the output electrode (Li+Lo) to the thickness H of element may be made to be not less than 3 not greater than 6, like the case with a single-use vibrator. In the double-mode filters, vibration modes other than the s_0 mode and the a_0 mode turn out to be the spurious. Therefore, in order not to pick up such vibrations in the form of electric signal, the length of an input electrode and the length of an output electrode should preferably be equal.

From the above-described results, it has become known that filters of superior temperature characteristics are implemented, like the case with single-use vibrators, by making a ratio Li/H of the length Li of the input electrode to the thickness H of the element and a ratio Lo/H of the length Lo of the output electrode to the thickness H of the element to be not less than 1.5 not greater than 3, respectively. Then, if an electrode area is increased by selecting a greatest possible value within the range not less than 1.5 not more than 3 in terms of the ratio between the input/output terminals and the element thickness, the insertion loss can be lowered in the high frequencies either. Like in the case of single-use vibrators, if a ratio W/H of the element width W to the element thickness H is selected from the W/H range where the spurious due to the width dimension does not exist at the vicinity of main vibration's resonance point, filters of superior temperature characteristics without spurious can be implemented.

Practical examples embodied in accordance with the present invention are described below referring to FIG. 14, FIG. 15 and FIG. 16.

(Embodiment 1)

Figure 14:
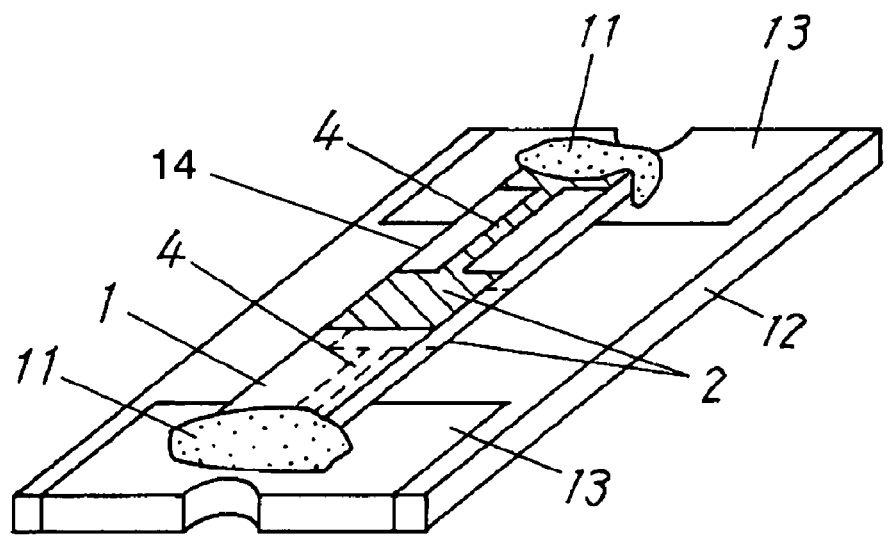
FIG. 14 is perspective view of a piezoelectric vibrator in a first exemplary embodiment of the present invention.

FIG. 14 shows a piezoelectric vibrator which uses the X plate of lithium tantalate and is primarily vibrated by thickness shear vibration. In the piezoelectric vibrator of this embodiment, piezoelectric vibrator 14 configured as shown in FIG. 1 is attached on mounting board 12 provided with external terminal 13, using gluing resin 11 which contains conductive material. As the thickness H of the vibrator is 20 $\mu$m, the resonance frequency is approximately 100 MHz. As the length Le of the exciting electrode is 100 $\mu$m, the ratio Le/H is 5, namely within the range 3–6.

As the width W of the vibrator is 80 $\mu$m, the ratio W/H is 4; therefore, the spurious due to the width dimension does not exist in the vicinity of the main vibration resonance. As the length L of the vibrator is 400 $\mu$m, the ratio L/H is 20, namely not less than 15. Consequently, vibration displacement at the end part of the vibrator has been sufficiently attenuated, and no spurious is caused by the reflected wave at the end part. Thus, vibrators of favorable temperature characteristics are realized.

(Embodiment 2)

Figure 15:
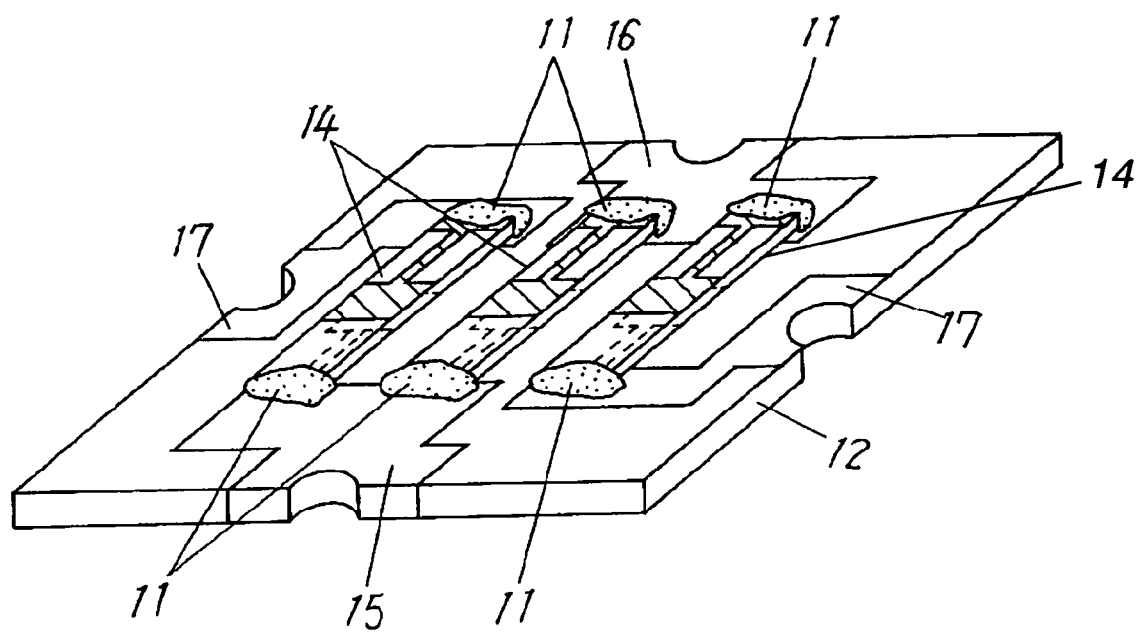
FIG. 15 is perspective view of a piezoelectric vibrator in a second exemplary embodiment of the present invention.

FIG. 15 shows a ladder-type filter which contains three pieces of piezoelectric vibrator 14 of FIG. 1 which uses the X plate of lithium tantalate and is primarily vibrated by thickness shear vibration.

In the same manner as in embodiment 1, piezoelectric vibrator 14 is attached, using conductive resin 11, on mounting board 12 provided with external terminal 15 for inputting, external terminal 17 for outputting and external terminal 16 for grounding. The ratio Le/H is 5 and the ratio L/H is 18, with each of the vibrators contained in the filter. The ratio W/H of the vibrators for forming the poles is 4, that of the vibrator for the pass band region is 2. Since the Le/H is within the range 3–6, frequency deviation due to temperature shift is small, and there is no influence by the spurious due to the reflected wave at the end part of vibrator, or by the spurious due to the width dimension. Furthermore, since a ratio of electrostatic capacitance between vibrators for forming the poles and that for pass band is greater than 1, it has an advantage of large attenuation amount outside the pass band region.

(Embodiment 3)

Figure 16:
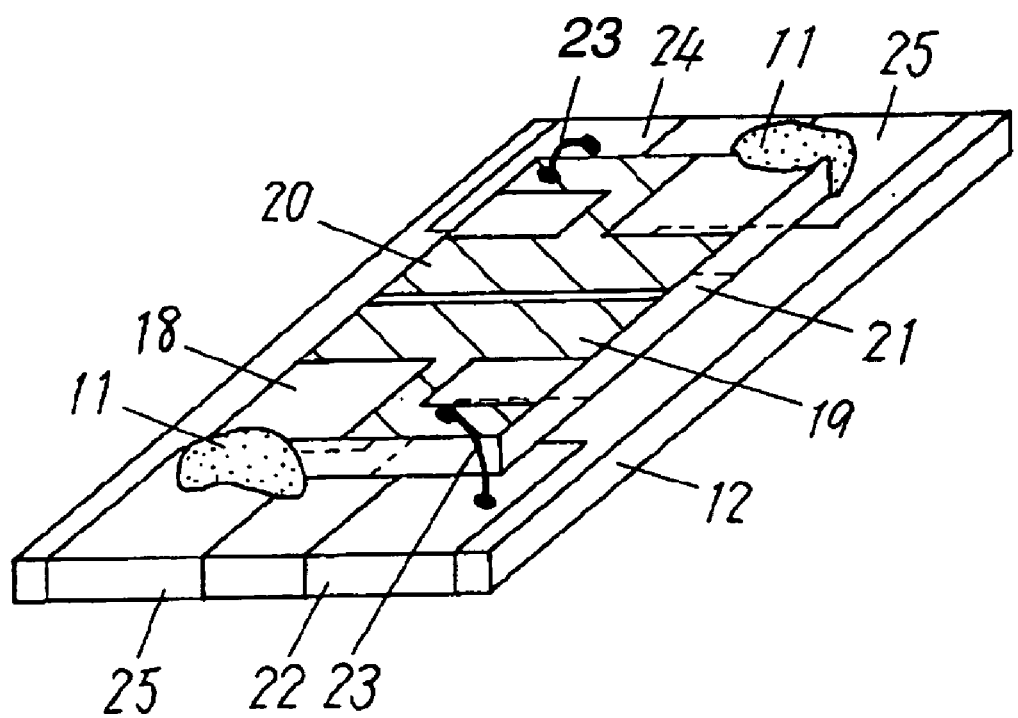
FIG. 16 is perspective view of a piezoelectric vibrator in a third exemplary embodiment of the present invention.
Figure 17:
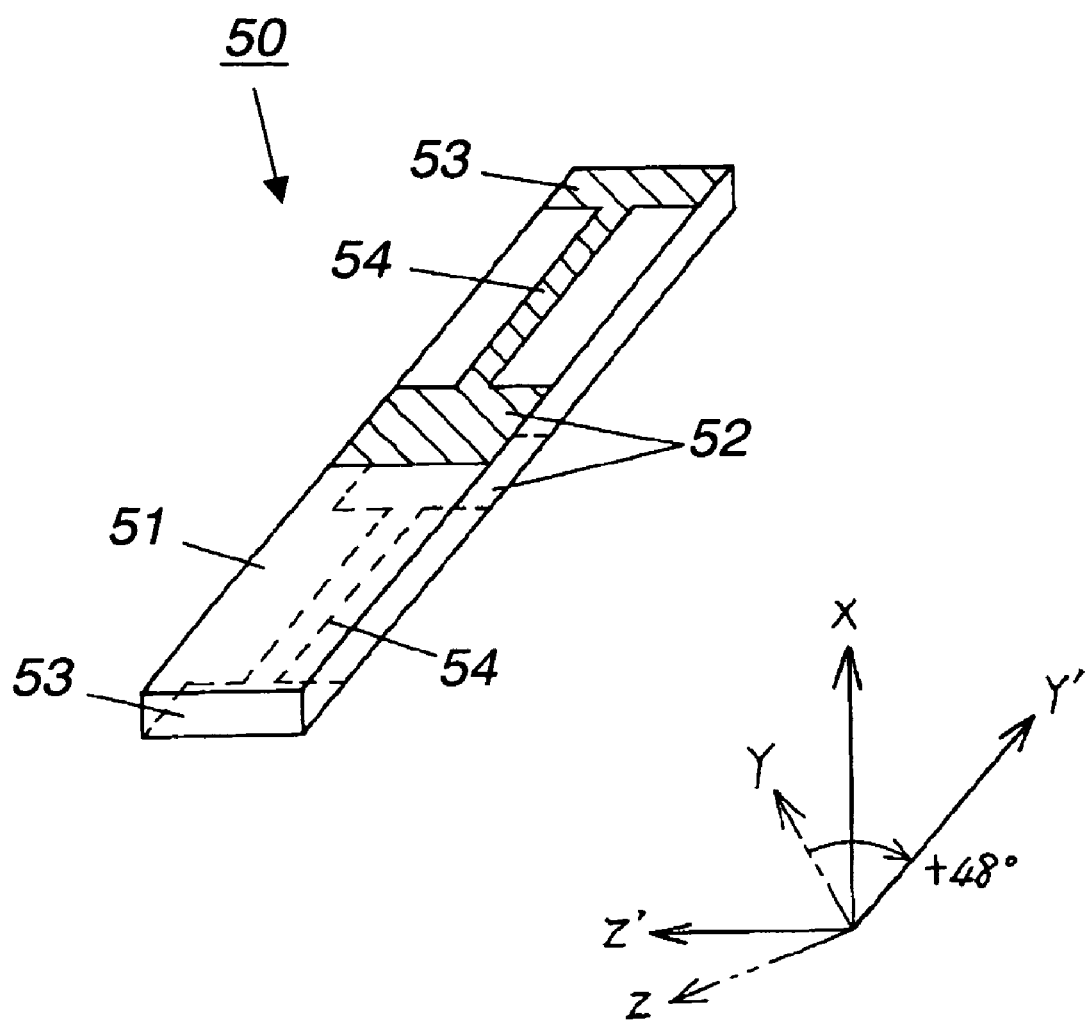
FIG. 17 is perspective view of a conventional piezoelectric vibrator.

FIG. 16 shows a double-mode piezoelectric filter which contains the X plate of lithium tantalate and is primarily vibrated by thickness shear vibration.

On the upper surface of vibrator element portion 18, input electrode 19 and output electrode 20 are provided in the proximity to each other, and ground electrode 21 on the reverse surface. Vibrator element portion 18 is attached on mounting board 22 using conductive resin 11. Mounting board 22 is provided with external terminal 22 for inputting, external terminal 24 for outputting and external terminal 25 for grounding. Input electrode 19, output electrode 20 of vibrator element portion 18 and external terminal 22, external terminal 24 provided on the mounting board are electrically connected, respectively, with fine metal wire 23. As the element thickness H is 25$\mu$m, the central frequency of the filter is approximately 80 MHz. As the length Li of the input electrode and the length Lo of the output electrode are both 60$\mu$m, the ratio Li/H and the ratio Lo/H are both 2.4, namely within a range 1.5–3. Therefore, the filter characteristics exhibit only small frequency deviation due to temperature shift. Furthermore, as the element width W is 100$\mu$m, the ratio W/H is 4. Therefore, favorable filter characteristics are implemented with no spurious due to the width dimension in the pass band region.

INDUSTRIAL APPLICABILITY

In a piezoelectric vibrator of the present invention which uses lithium tantalate as piezoelectric material, the thickness direction of vibrator forms an angle of 0°±5° to the X-axis, the longitudinal direction of vibrator lies, with the X-axis used as rotation axis, in a direction +57°±2° clockwise from Y-axis, and is primarily vibrated by thickness shear vibration; a ratio L/H of the length L of vibrator to the thickness H of vibrator is at least 15, a ratio Le/H of the length Le of exciting electrode to the thickness H of vibrator is not more than 3–6. Under the above-described configuration, the longitudinal direction of vibrator is in line with the cleavage direction; which facilitates easy processing during manufacturing operation, and secures a large area for the exciting electrode. Thus the vibrators in the present invention have a high Q in the high frequencies, and superior temperature characteristics.

What is claimed is:

1. A piezoelectric vibrator primarily vibrated by thickness shear vibration comprising a vibrator element portion formed of single crystal lithium tantalate, and an exciting electrode provided on said vibration element portion; wherein a thickness direction of said vibrator element portion forms an angle of 0°±5° to the X-axis of said single crystal, a longitudinal direction of said vibrator element portion lies, with said X-axis used as a rotation axis, in a direction ×57°±2° clockwise from the Y-axis of said single crystal, a ratio L/H of the length L of said vibrator element portion to the thickness H is not less than 15, and a ratio Le/H of the length Le of said exciting electrode to the thickness H of said vibrator element portion is 3–6.

2. The piezoelectric vibrator of claim 1, wherein a ratio W/H of the width W of said vibrator element portion to the thickness H of said vibrator element is selected from the group consisting of 1.5–2.1, 2.5–3.2, 3.7–4.3 and 4.9–5.3.

* * * * *